United States Patent
Yokawa

(10) Patent No.: US 8,708,293 B2
(45) Date of Patent: Apr. 29, 2014

(54) DEVICE SUBSTRATE ATTACHMENT STRUCTURE

(75) Inventor: Akira Yokawa, Daito (JP)

(73) Assignee: Funai Electric Co., Ltd., Osaka (JP)

(*) Notice: Subject to any disclaimer, the term of this patent is extended or adjusted under 35 U.S.C. 154(b) by 108 days.

(21) Appl. No.: 13/429,708

(22) Filed: Mar. 26, 2012

(65) Prior Publication Data

US 2012/0256066 A1 Oct. 11, 2012

(30) Foreign Application Priority Data

Apr. 7, 2011 (JP) ................................. 2011-085765

(51) Int. Cl.
*A47B 96/06* (2006.01)
(52) U.S. Cl.
USPC ................... 248/224.8; 361/752; 361/679.02; 349/58
(58) Field of Classification Search
USPC .............. 248/224.8; 361/752, 679.02; 349/58
See application file for complete search history.

(56) References Cited

U.S. PATENT DOCUMENTS

| | | | | |
|---|---|---|---|---|
| 5,388,792 A | * | 2/1995 | Hastings et al. ........... | 248/188.1 |
| 5,675,397 A | * | 10/1997 | Fukushima ................... | 349/149 |
| 5,769,668 A | * | 6/1998 | Tondreault .................... | 439/633 |
| 6,675,470 B2 | * | 1/2004 | Muramatsu ...................... | 29/832 |
| 6,729,888 B2 | * | 5/2004 | Imaeda .......................... | 439/66 |
| 7,626,672 B2 | * | 12/2009 | Song ............................. | 349/150 |
| 7,929,318 B2 | * | 4/2011 | Matsutani ..................... | 361/802 |
| 8,164,703 B2 | * | 4/2012 | Cheng et al. .................... | 349/58 |
| 2006/0133018 A1 | * | 6/2006 | Okuda .......................... | 361/681 |
| 2006/0198092 A1 | * | 9/2006 | Searby .......................... | 361/683 |
| 2008/0116045 A1 | | 5/2008 | Matsutani | |
| 2011/0170251 A1 | * | 7/2011 | Hood et al. .............. | 361/679.02 |

FOREIGN PATENT DOCUMENTS

| | | |
|---|---|---|
| JP | 2008-4801 A | 1/2008 |
| JP | 2008-129369 A | 6/2008 |
| JP | 2009-181037 A | 8/2009 |

* cited by examiner

*Primary Examiner* — Terrell McKinnon
*Assistant Examiner* — Daniel J Breslin
(74) *Attorney, Agent, or Firm* — Keating & Bennett, LLP

(57) ABSTRACT

In a device substrate attachment structure, when a substrate including a terminal holder attached to an end portion thereof is attached to a frame made of sheet metal, the substrate is attached to the frame via the terminal holder without using a screw fastening structure. The terminal holder is attached to the frame via an engagement/disengagement mechanism. The engagement/disengagement mechanism includes through-hole portions on a side of the frame, a seat portion, claw portions, and leg portions on the side of the terminal holder, and a positioning mechanism on the side of a cabinet. The positioning mechanism includes rim portions of an opening window of the cabinet.

6 Claims, 10 Drawing Sheets

DEVICE SUBSTRATE ATTACHMENT STRUCTURE

BACKGROUND OF THE INVENTION

1. Field of the Invention

The present invention relates to a device substrate attachment structure, and particularly to a device substrate attachment structure for electrical and electronic equipment or the like for which a countermeasure is provided to make it possible to attach a substrate to a substrate holding body including a frame made of sheet metal or the like without using attachment screws.

2. Description of the Related Art

FIG. 9 is a schematic perspective view showing a conventional example of a device substrate attachment structure. This example is a device substrate attachment structure for a liquid crystal television receiver, and a substrate 50 is attached to a frame 10 made of sheet metal that is provided on the back portion of a liquid crystal module. The frame 10 has, at a plurality of locations of the flat portion thereof, bulging parts 11 that are each formed into a substantially circular truncated cone shape. In contrast to this, terminals 61 such as jacks, other necessary electrical and electronic parts 62, and the like are mounted on the rectangular substrate 50. Furthermore, a terminal holder 60 that holds the terminals 61 is installed at an end portion of the substrate 50, and the substrate 50 and the terminal holder 60 are joined by a known fixing mechanism that is not illustrated. Then, the substrate 50 equipped with the terminal holder 60 is screw-fastened to the apex portions of the bulging parts 11 at a plurality of locations using attachment screws 12 in a state of being mounted over the bulging parts 11 of the frame 10.

In the device substrate attachment structure, between the substrate 50 and the frame 10, a gap is formed which corresponds to the height of the bulging parts 11. The gap serves as a space for preventing electrical shorts resulting from the sheet metal frame 10 being contacted by the circuit pattern, terminal pins, solder protrusions, or the like of the substrate 50. Moreover, the gap also serves as an accommodation space for electrical and electronic parts mounted on the back surface of the substrate 50. In addition, the gap is designed to reliably avoid the danger of shorts or the like by giving a certain margin for the depth of the gap. Furthermore, though not illustrated, the terminal holder 60 is also screw-fastened to the frame 10.

FIG. 10 is an explanatory diagram showing forbidden bands added to the substrate 50 that is fixed to the frame 10 by the screw fastening structure adopted in the conventional example of FIG. 9. A "forbidden band" is an area on a plate surface in which forming of a circuit pattern is forbidden, or an area on a plate surface in which mounting of a mounting space for electrical and electronic parts (including terminals) is forbidden. The substrate 50 shown in FIG. 10 is formed in a rectangular shape, and terminals 61 such as jacks are mounted in a line on each of the two end portions in the lengthwise direction of the substrate 50. When the substrate 50 is attached to the frame 10 by adopting the device substrate attachment structure according to the conventional example described with reference to FIG. 9, not only is it necessary to provide unavoidable forbidden bands Z1 at the locations indicated by the dotted-line cross hatching in this figure, i.e., between adjacent terminals 61 arranged in a line, but it is also necessary to provide forbidden bands Z2 at locations facing the other sites for screw fastening, specifically, the locations facing the bulging parts 11 provided on the frame 10 (see FIG. 9). Moreover, when the ratio of a total area of the forbidden bands Z1 and Z2 with respect to the entire area of the plate surface of the substrate 50 was calculated for certain specific models, this was found to be approximately 11.5%, and it became clear that ten percent or more of the space on the substrate 50 is occupied by the forbidden bands Z1 and Z2.

Meanwhile, proposed in a prior example is an invention that relates to a structure for attaching a circuit substrate used for liquid crystal display devices, plasma display devices, or the like to a support member (for example, see Japanese Patent Application Laid-Open Publication No. 2008-4801). The substrate attachment structure proposed in Japanese Patent Application Laid-Open Publication No. 2008-4801 combines the engagement of attachment claws provided on the side of the support member with parts to be attached of the circuit substrate, and screw fastening of the substrate to the support member at a plurality of locations.

In addition, proposed in another prior example is a power supply switch attachment structure for a thin liquid crystal display device (for example, Japanese Patent No. 4241805 corresponding to Japanese Patent Application Laid-Open Publication No. 2008-129369). It is indicated in Japanese Patent No. 4241805 that a jack holder provided at an end portion of a substrate is screw-fastened to the main substrate.

In contrast to each of these prior examples, prior examples adopting a structure that fixes a substrate without using attachment screws have also been proposed (for example, see Japanese Patent Application Laid-Open Publication No. 2009-181037). With the structure proposed in Japanese Patent Application Laid-Open Publication No. 2009-181037, in addition to a long and narrow substrate being laid across between a pair of left and right ribs provided integrally with the front cabinet of a display device, one end portion of the substrate in the lengthwise direction, the other end portion of which in the lengthwise direction is engaged with one of the ribs, is engaged with a hook-shaped rib.

However, with the conventional example adopting a screw fastening structure such as that shown in FIG. 9, as was described with reference to FIG. 10, there is a need to secure a space of ten percent or more of the plate surface of the substrate 50 as the forbidden bands Z1 and Z2, so the effective usable area of the substrate 50 ends up becoming correspondingly smaller. As a result, compared to the substrate 50 of the originally required size, there is no choice but to use a substrate 50 of a size that is larger to the extent that it corresponds to the area of the forbidden bands Z2 determined at locations facing the bulging parts 11 on the side of the frame 10 (see FIG. 9) of the forbidden bands Z1 and Z2, thus posing a problem in that this easily brings about an increase in the cost and size of the substrate installation space.

Furthermore, not only is there the trouble of having to perform screw fastening at several locations, but there is also the problem that, when the attachment screws 12 are repeatedly attached and detached with respect to the screw holes provided in the apex portions of the bulging parts 11 of the frame 10, these screw holes end up losing their function as such and becoming so-called "loose holes," which makes it impossible to tighten the attachment screws 12 at these locations.

Meanwhile, with the example described in Japanese Patent Application Laid-Open Publication No. 2009-181037 which does not adopt a screw fastening structure, there is no way to encounter the trouble of having to perform screw fastening or to create the problem of having the screw holes end up becoming so-called "loose holes." However, the locking structure proposed in Japanese Patent Application Laid-Open Publication No. 2009-181037 merely proposes a structure for having a long, narrow, flat substrate be bridged across a pair of left and right ribs formed as an integral unit with the front cabinet composed of a resin molded body. Therefore, as the substrate attachment structure such as the one having the terminal holder 60 attached to the end portion thereof as in the substrate shown in FIG. 9, when considering that the terminal holder 60 will become an obstacle, it is difficult to use this structure "as is" as a substrate attachment structure such as one having the terminal holder 60 attached thereto.

SUMMARY OF THE INVENTION

In light of the aforementioned problems and circumstances, preferred embodiments of the present invention provide a device substrate attachment structure such that, when a substrate having a member such as a terminal holder attached to an end portion thereof is attached to a substrate holding body such as a frame, the substrate can be attached to the substrate holding body without using a fastening screw by simply utilizing the member attached to the end portion of the substrate.

The device substrate attachment structure according to a preferred embodiment of the present invention includes a substrate holding body and an attachment mechanism to fix a substrate to the substrate holding body. Furthermore, the attachment mechanism includes an attachment member attached to the substrate holding body, an engagement/disengagement mechanism arranged to attach the attachment member to the substrate holding body, and a fixing mechanism which joins the attachment member to an end portion of the substrate.

The substrate holding member preferably is a flat plate-shaped member such as the frame, for example.

Moreover, the engagement/disengagement mechanism includes a through-hole portion provided in the substrate holding body, a seat portion that is provided on the attachment member and that contacts a hole edge portion of the through-hole portion, a claw portion that is arranged to slide between a position at which the claw portion clamps the hole edge portion by working conjointly with the seat portion and a position at which insertion into and removal from the through-hole portion is possible, a leg portion that is inserted into the through-hole portion so as to allow displacement in the sliding direction of the claw portion and that links the claw portion and the attachment member, and a positioning mechanism arranged to position the attachment member at the position at which the claw portion clamps the hole edge portion by working conjointly with the seat portion.

With a device substrate attachment structure including the structure described above, the attachment member joined to the end portion of the substrate by the fixing mechanism is attached to the substrate holding body via the engagement/disengagement mechanism. Then, at the attachment locations of the attachment member and the substrate holding body, due to the action of the engagement/disengagement mechanism, the seat portion and the claw portion clamp a rim portion of the through-hole portion of the substrate holding body. As a result, the substrate is attached to the substrate holding body via the attachment member without using attachment screws, and the attachment position is regulated by the positioning mechanism. In addition, because the seat portion, the claw portion, and the leg portion of the engagement/disengagement mechanism are preferably provided as an integral unit on the attachment member, there is no need to form these elements as separate components. Furthermore, when the substrate is to be removed from the substrate holding body, all that is required is to slide the claw portion to the position which allows insertion into and removal from the through-hole portion on the side of the substrate holding body and to remove the claw portion from the through-hole portion.

In a preferred embodiment of the present invention, it is particularly desirable to adopt a constitution in which the attachment member is preferably defined by a terminal holder that holds terminals mounted on the substrate, the device including a cabinet having an opening window that exposes the attachment member to the outside, and the positioning mechanism is defined by rim portions of the opening window positioned at both sides of two end portions of the terminal holder in the width direction. With this constitution, the terminal holder joined via the fixing mechanism to the end portion of the substrate on which the terminals are mounted is utilized as the attachment member, so there is an advantage in that it is not necessary to separately join the attachment member to the end portion of the substrate. Moreover, the terminal holder that is attached to the substrate holding body without using attachment screws is positioned by the rim portions of the opening window of the cabinet preferably used as the positioning mechanism, so there is also an advantage in that no extra member is required to position the terminal holder.

In a preferred embodiment of the present invention, it is preferable that the seat portion of the engagement/disengagement mechanism be defined by an end surface of the terminal holder which faces the claw portion in the height direction of the terminal holder. With this constitution, the end surface of the terminal holder that preferably defines the attachment member can be utilized as the seat portion of the engagement/disengagement mechanism.

In a preferred embodiment of the present invention, it is preferable to adopt a constitution such that the fixing mechanism includes a bifurcated rib that defines a gap in which the end portion of the substrate is inserted, a clamping piece that clamps the substrate in a direction perpendicular or substantially perpendicular to the direction of insertion of the substrate into the gap, and an engagement claw that is provided on the clamping piece and that engages with a recessed portion provided in the substrate to inhibit displacement of the substrate in the direction of removal from the gap, and also such that the bifurcated rib and the clamping piece that includes the engagement claw are made of resin with the attachment member to define an integral monolithic unit. With this constitution, there is no need to perform screw fastening of the attachment member or the terminal holder defining the attachment member to the end portion of the substrate.

Thus, with the device substrate attachment structure according to a preferred embodiment of the present invention, a constitution is adopted in which the attachment member joined to the end portion of the substrate can be attached to the substrate holding body without using attachment screws and also such that the attachment position of the attachment member to the substrate holding body is regulated by the positioning mechanism, so it is no longer necessary to use attachment screws to attach the substrate to the substrate holding body. For this reason, the trouble of having to perform screw fastening at several locations is eliminated, and it is no longer possible for the problem of the screw holes becoming so-called "loose holes" to occur.

In particular, a terminal holder joined to the end portion of the substrate can be used as the attachment member, and when a device substrate attachment structure according to a preferred embodiment of the present invention is compared with the conventional example described above, the attachment screws are omitted, and the need to use an extra attachment member is eliminated, so the number of parts and assembly man-hours are reduced, thus making it possible to easily achieve cost reduction in conjunction therewith. In addition, compared to a structure in which the substrate is fastened by screws to the bulging parts of the frame, the height restriction of the bulging parts or height dimension precision is eased. Furthermore, the surface area of the substrate occupied by the forbidden bands is significantly reduced compared to the conventional examples, so there is also an advantage in that the size of the substrate can be commensurately reduced more easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
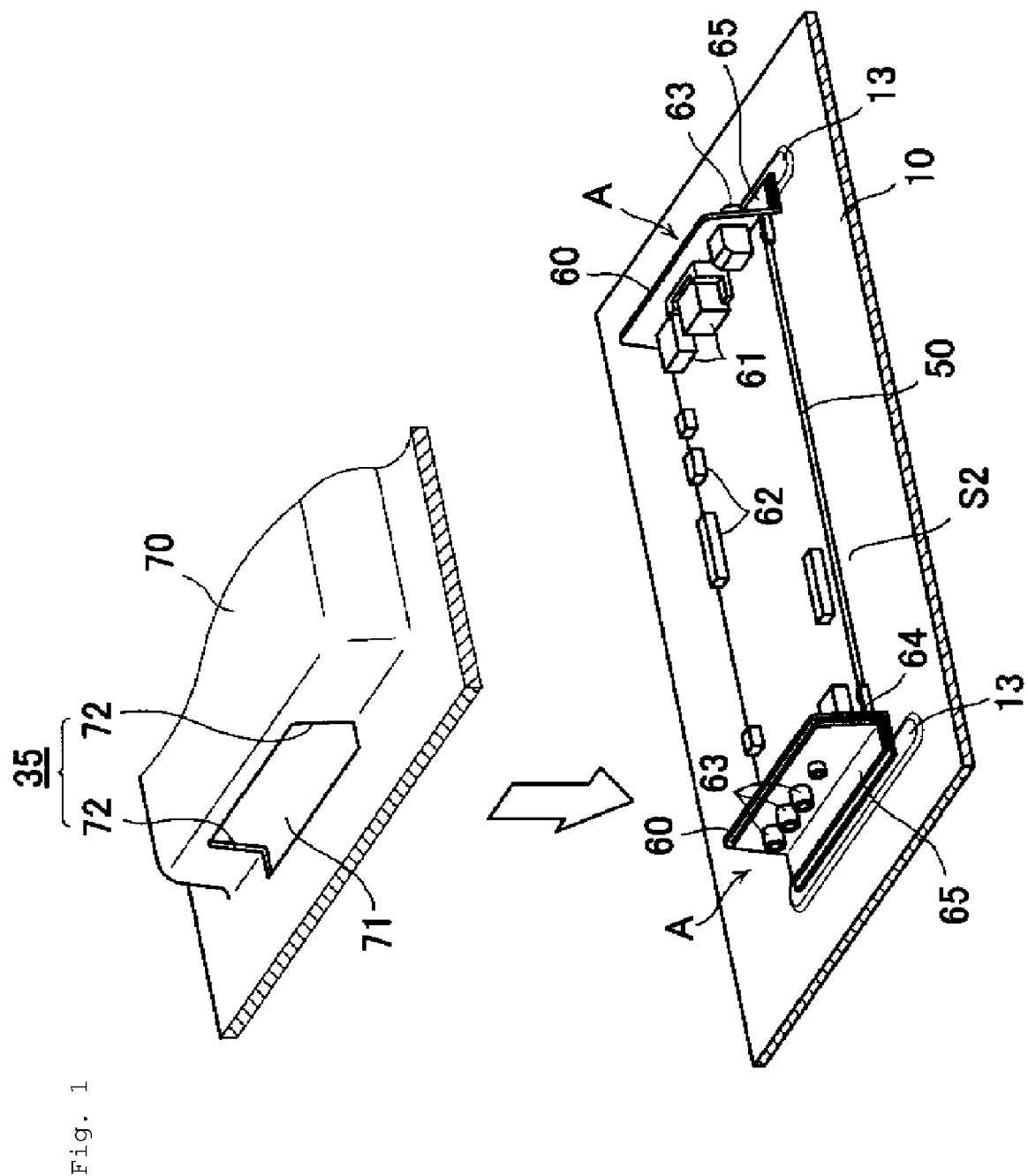
FIG. 1 is an exploded perspective view schematically showing the device substrate attachment structure according to a preferred embodiment of the present invention.

FIG. 1 is an exploded perspective view schematically showing a non-limiting example of a device substrate attachment structure according to a preferred embodiment of the present invention. The example of FIG. 1 shows a device substrate attachment structure for use with a liquid crystal-type television receiver as the electrical and electronic equipment. FIG. 1 shows a frame 10 preferably made of sheet metal that is provided on the back portion of a liquid crystal module, a rectangular substrate 50, separate terminal holders (one example of an attachment member) 60, 60 respectively joined to the two end portions of the substrate 50, terminals 61 such as jacks and other necessary electrical and electronic parts 62 mounted on the substrate 50, and a cabinet 70 which covers the frame 10, the substrate 50, and the like. The sheet metal frame 10 and the terminal holders 60 are examples of the substrate holding body and the attachment member, respectively according to a preferred embodiment of the present invention.

Figure 2:
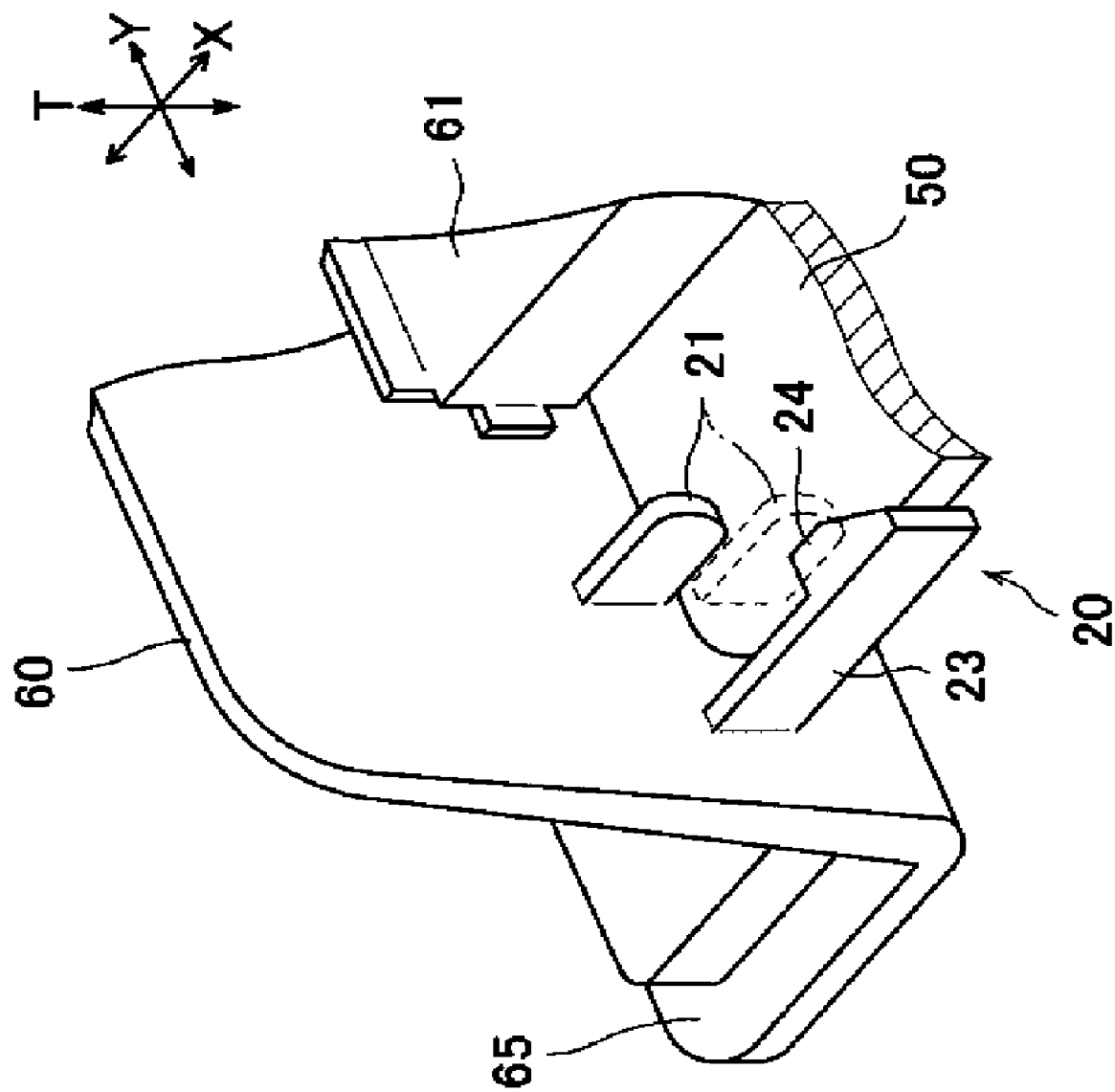
FIG. 2 is a schematic perspective view of principal portions showing the joined locations of the substrate and a terminal holder.
Figure 3:
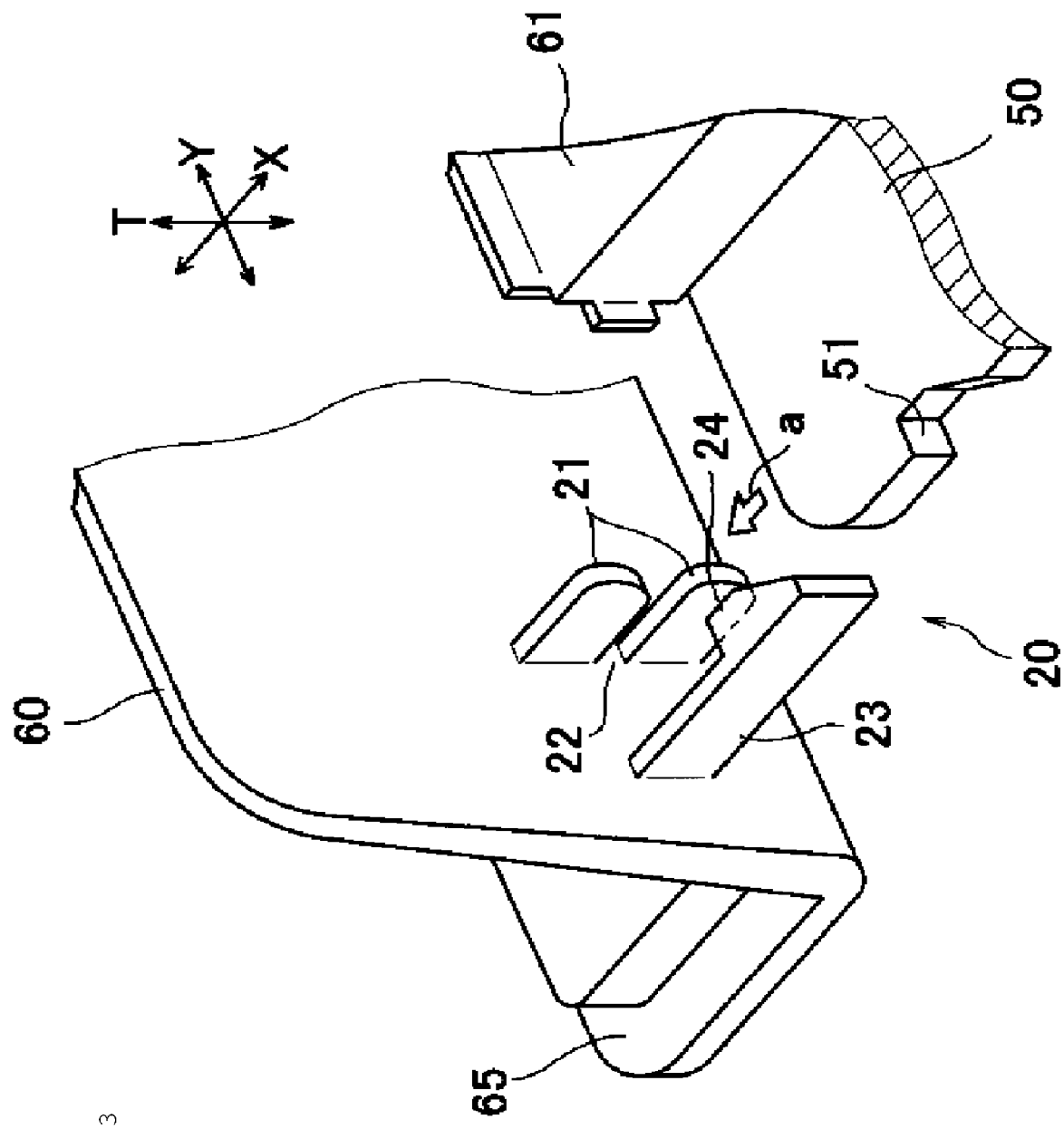
FIG. 3 is an exploded perspective view of the principal portions showing the substrate and the terminal holder.
Figure 4:
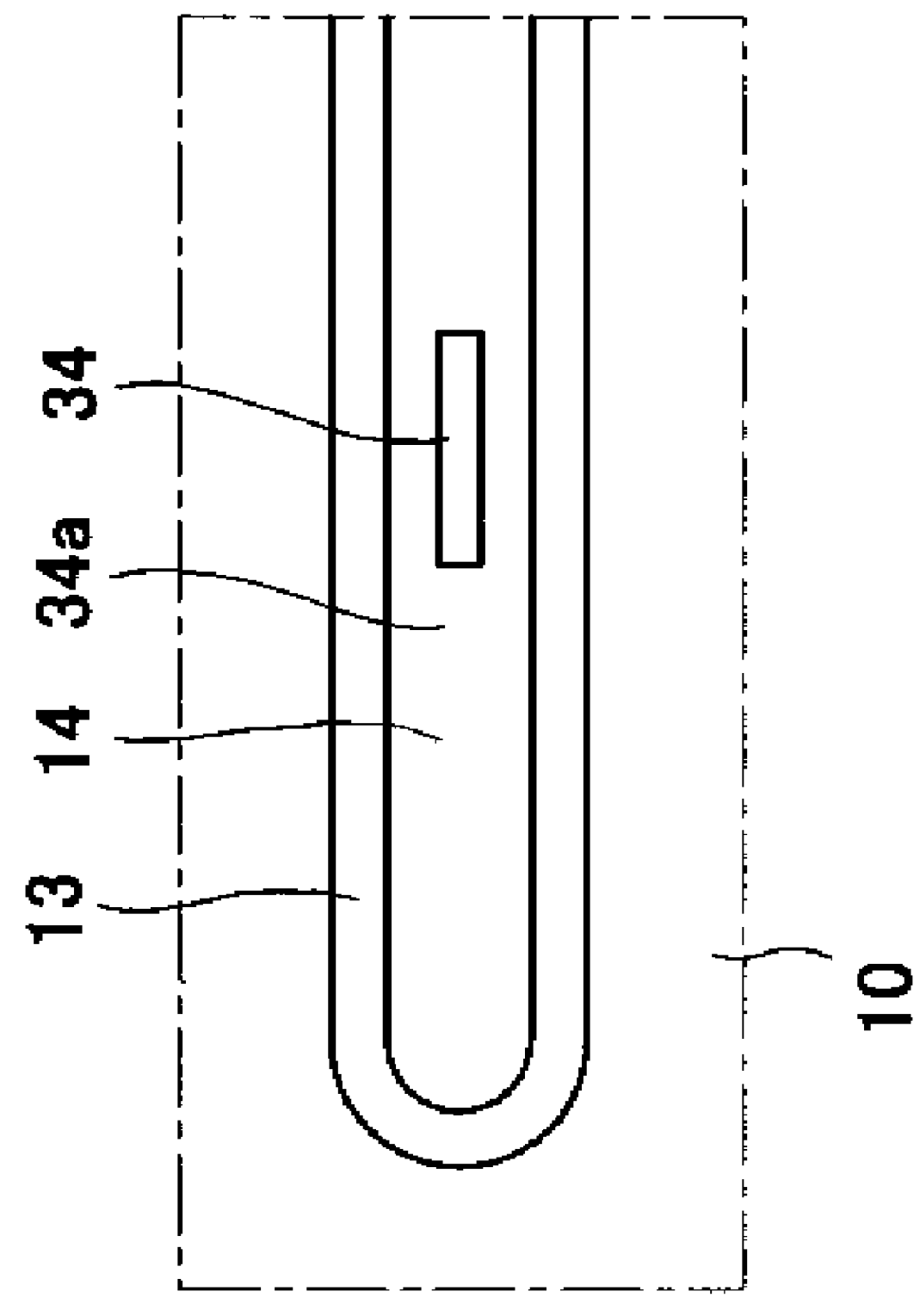
FIG. 4 is a plan view showing principal portions of the frame.

FIG. 2 is a schematic perspective view of principal portions showing the joined locations of the substrate 50 and one of the terminal holders 60, and FIG. 3 is an exploded perspective view of the principal portions showing the substrate 50 and the terminal holder 60. Furthermore, FIG. 4 is a plan view showing principal portions of the frame 10, FIG. 5 is a partial fractured side view showing an engagement/disengagement mechanism 30, and FIG. 6 is an enlarged partial fractured side view of the principal portions in FIG. 5.

Figure 5:
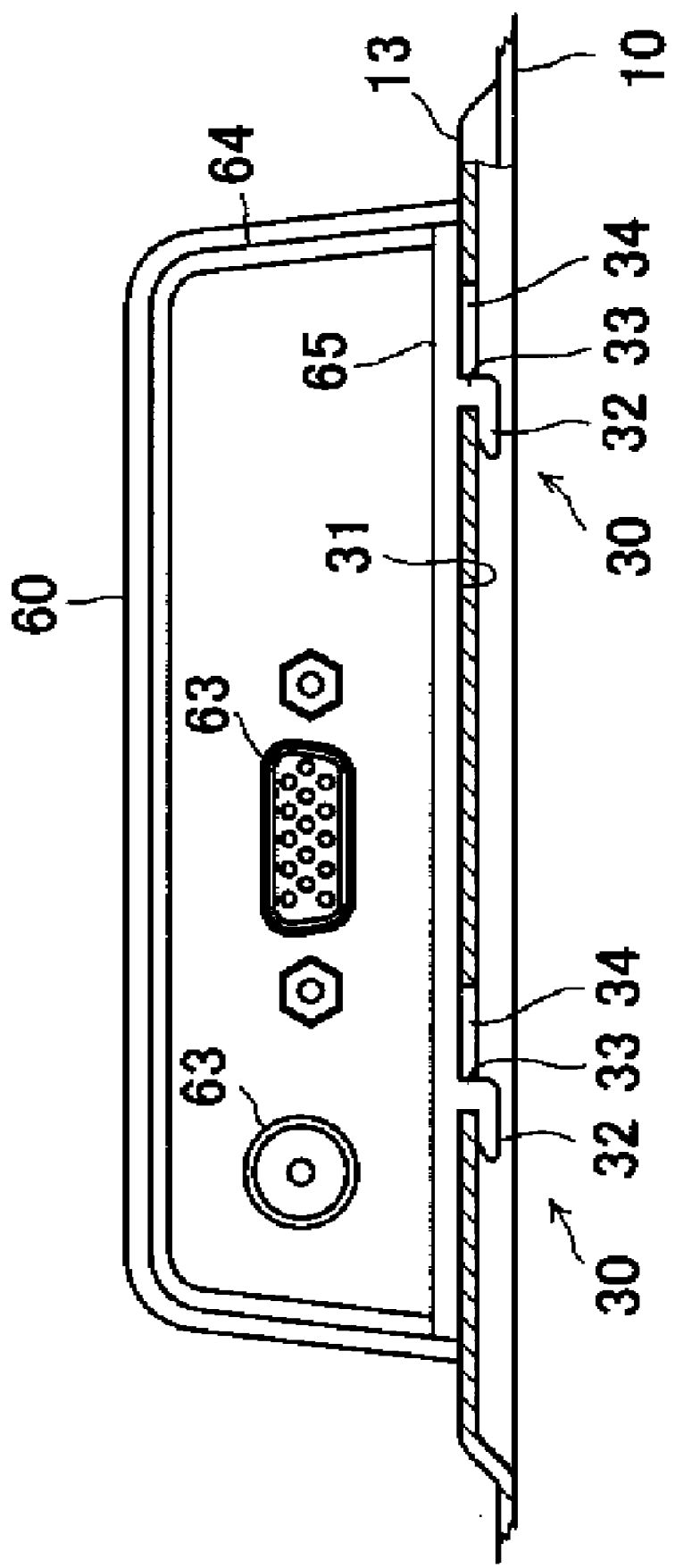
FIG. 5 is a partial fractured side view showing an engagement/disengagement mechanism.
Figure 6:
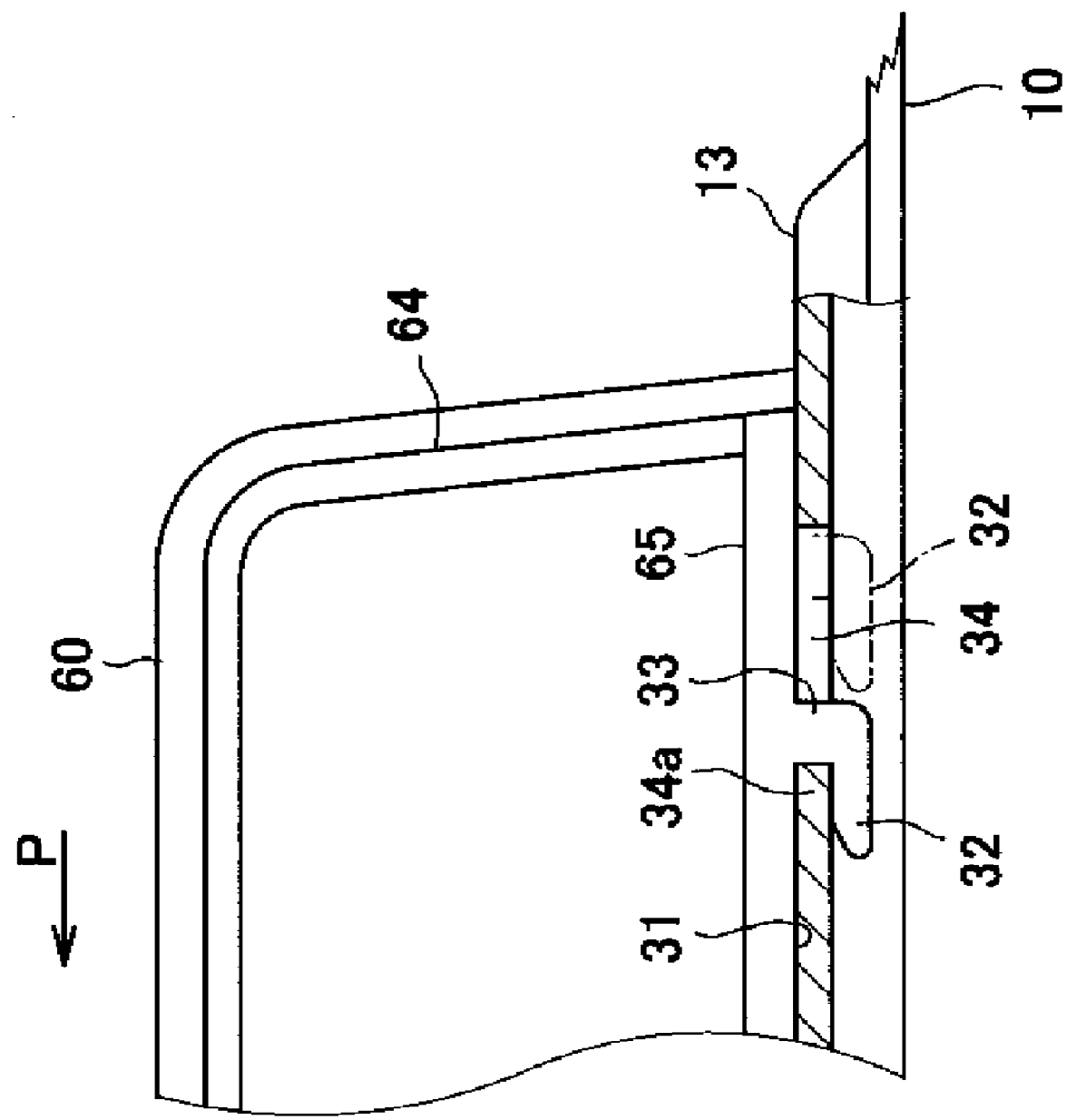
FIG. 6 is an enlarged partial fractured side view of the principal portions in FIG. 5.

The attachment mechanism A (see FIG. 1) which fixes the substrate 50 on the frame 10 includes the terminal holders defining the attachment member, the fixing mechanisms 20 shown in FIGS. 2 and 3, and the engagement/disengagement mechanisms 30 shown in FIG. 5 or the like.

The fixing mechanisms 20 are used to join the terminal holders 60 to the end portions of the substrate 50. As is shown in FIGS. 2 and 3, each of the fixing mechanisms 20 preferably includes a bifurcated rib 21 provided on the back surface of a terminal holder 60 including a board piece-shaped resin molded body and a clamping piece 23 integrally including an engagement claw 24 and provided with elasticity, and such a bifurcated rib 21 and clamping piece 23 are preferably formed of resin together with the terminal holder 60 to define a monolithic integral unit. The horizontal width of the terminal holder 60 is slightly longer than the dimension (horizontal width) of the substrate 50 in the width direction (arrow Y direction) which is perpendicular or substantially perpendicular to the lengthwise direction (arrow X direction), and the fixing mechanisms 20 are respectively provided at two end portions of the terminal holder 60 preferably in the width direction. Note that FIGS. 2 and 3 show, in the terminal holder 60 joined to one end portion of the substrate 50 in the lengthwise direction, only the fixing mechanism 20 provided on one side in the horizontal width direction of the terminal holder 60, but the constitution of the fixing mechanism provided on the other side in the horizontal width direction thereof is preferably the same as the illustrated fixing mechanism 20. In light of this, the fixing mechanisms 20 in these two locations may be referred to as the left and right fixing mechanisms in the following description.

As is shown in FIG. 3, the bifurcated rib 21 and clamping piece 23 of each fixing mechanism 20 overhang at the back of the corresponding terminal holder 60. Moreover, one end portion of the substrate 50 in the lengthwise direction is inserted in the gap 22 of the bifurcated rib 21 as indicated by the arrow "a" in this figure. In addition, as is shown in FIG. 2, the clamping piece 23 of the fixing mechanism 20 is positioned at a side portion of one end portion in the lengthwise direction of the substrate 50 that is inserted in the gap 22 (see FIG. 3) of the bifurcated rib 21. Then, the engagement claw 24 provided at the tip end of the clamping piece 23 is engaged with a recessed portion 51 provided in the substrate 50 at a location in the vicinity of one end portion in the lengthwise direction at the side periphery thereof.

As was described above, the fixing mechanisms 20 are respectively provided on one side and on the other side of each terminal holder 60 in the horizontal width direction, and the constitutions thereof are preferably the same. For this reason, two locations at one end portion of the substrate 50 in the lengthwise direction X thereof are respectively inserted in the gaps 22 of the bifurcated ribs 21 of the left and right fixing mechanisms 20. Therefore, the bifurcated ribs 21 of the left and right fixing mechanisms 20 perform the positioning of the substrate 50 by clamping the substrate 50 in the thickness direction (arrow T direction) shown in FIG. 2. As a result of the bifurcated ribs 21 of the left and right fixing mechanisms 20 positioning the substrate 50 in the thickness direction in this manner, the terminal holder 60 is prevented from rattling in the thickness direction of the substrate 50 so as to achieve a thickness-direction positioning effect. Furthermore, at one end portion of the substrate 50 in the lengthwise direction, the clamping pieces 23 of the left and right fixing mechanisms 20 face each other against the end portions on both sides of the substrate 50 in the width direction, and the engagement claws 24 of the clamping pieces 23 are also engaged with the recessed portions 51 on both sides in the width direction of the substrate 50. As a result, this structural arrangement prevents a situation in which the terminal holder 60 is displaced in the removal direction from one end portion of the substrate 50 in the lengthwise direction and ends up falling out from the substrate 50 to achieve a terminal-holder fall-out prevention effect. Moreover, the engagement claws 24 at both sides of the substrate 50 in the width direction elastically clamp the substrate 50 due to the elasticity of the clamping pieces 23 of the left and right fixing mechanisms 20. Because of this, rattling of the terminal holder 60 in the width direction of the substrate 50 is prevented so as to achieve a width-direction positioning effect.

The constitution and effects of the fixing mechanisms 20 joining a respective one of the terminal holders 60 to one end portion of the substrate 50 in the lengthwise direction were described with FIGS. 2 and 3, but the constitution and effects are also the same for the fixing mechanism 20 joining the other terminal holder 60 to the other end portion of the substrate 50 in the lengthwise direction.

Next, the constitution and effects of the engagement/disengagement mechanisms 30 will be described with reference to FIG. 1, 4, 5 or 6. As is shown in FIG. 1, the terminal holders 60, 60 that are respectively joined to one end portion and to the other end portion of the substrate 50 in the lengthwise direction preferably include resin molded bodies integrally provided with board piece-shaped flange portions 65, 65 which protrude to the outside (directions extending away from the substrate 50) at the lower end portion in the height direction thereof.

Each of the engagement/disengagement mechanisms 30 preferably includes a seat portion 31, a claw portion 32, and a leg portion 33 that are provided on the side of the corresponding terminal holder 60, a through-hole portion 34 provided on the side of the frame 10, and a positioning mechanism 35 provided on the side of the cabinet 70.

As is shown in FIG. 5 or 6, the seat portion 31 provided on each terminal holder 60 is preferably defined by the end surface of the terminal holder 60 that faces the claw portions 32 in the height direction of the terminal holder 60, specifically, by the bottom surface of the terminal holder 60, and the seat portion 31 faces the claw portion 32 with a gap left open. In addition, the leg portions 33 respectively link the terminal holder 60 and the claw portions 32. In other words, the claw portions 32 overhang at the tip ends of the leg portions 33 that extend out from the terminal holder 60, and the claw portions 32 define hooks that face the seat portion 31 with a gap left open. Furthermore, the gaps between the seat portion 31 and the claw portions 32 are determined to have a dimension that is equal or substantially equal to the thickness of the frame 10. In relation to this, the through-hole portions 34 on the side of the frame 10 are preferably provided in the flat apex portion 14 of a horizontally elongated bulging portion 13 provided on the frame 10 as shown in FIG. 4. The through-hole portions 34 of the illustrated example preferably are each formed to have a horizontally elongated slit shape and a length that allows for the insertion and removal of the claw portions 32. Moreover, each of the positioning mechanisms 35 provided on the side of the cabinet 70 is preferably defined by mutually facing rim portions 72, 72 of an opening window 71 provided in the cabinet 70 as shown in FIG. 1.

Each engagement/disengagement mechanism 30 is used to attach a terminal holder 60 to the frame 10. Specifically, when a terminal holder 60 is to be attached to the frame 10, the claw portions 32 of the engagement/disengagement mechanism 30 are respectively inserted together with the leg portions 33 thereof through the through-hole portions 34, which causes the claw portions 32 to be positioned on the back side of the frame 10 as shown by the dotted line in FIG. 6. Next, when the terminal holder 60 is moved as in the arrow P in FIG. 6, the leg-portions 33 are displaced in the interior of the through-hole portions 34, and the claw portions 32 and the seat portion 31 slide with respect to the frame 10, thereby the claw portions 32, working conjointly with the seat portion 31, respectively clamp the hole edge portions 34a of the through-hole portions 34 as shown by the solid line in this figure. As a result of the claw portions 32 working conjointly with the seat portion 31 to clamp the hole edge portions 34a of the through-hole portions 34 in the frame in this manner, the terminal holder 60 is attached to the frame 10. Therefore, the terminal holder 60 is temporarily fixed to the frame 10 without fastening by screws, and the substrate 50 is temporarily fixed to the frame 10 via the terminal holder 60 without relying on screw fastening.

In FIGS. 4, 5, and 6, the seat portion 31, the claw portions 32, the leg portions 33, and the through-hole portions of the engagement/disengagement mechanism 30 correspond to the terminal holder 60 on one side of the two terminal holders 60, 60 shown in FIG. 1. The elements of the engagement/disengagement mechanism corresponding to the terminal holder 60 of the other side preferably have the same constitution.

The positioning mechanism 35 shown in FIG. 1 is used to position a terminal holder 60 in the position at which the claw portions 32 of the terminal holder 60 work conjointly with the seat portion 31 to clamp the hole edge portions 34a of the through-hole portions 34 as shown in FIG. 5 or 6. Specifically, the cabinet 70 shown in FIG. 1 corresponds to the rear cabinet of a liquid crystal-type television receiver and covers the frame 10 of the liquid crystal module, the substrate 50 attached to the frame 10, and the like by working conjointly with a front panel (not illustrated). When the rear cabinet constituting the cabinet 70 is joined together with the front panel, each opening window 71 thereof is blocked by the corresponding terminal holder 60, and the insertion ports 63 of the terminals 61 such as jacks overhanging from the terminal holder 60 are exposed on the rear side of the cabinet 70. In addition, the hole edge portions 72, 72 on both sides of the opening window 71 grasp a stepped portion 64 (see FIGS. 1, 5, and 6) provided on the outer surface side of the terminal holder 60 in the horizontal width direction of the terminal holder 60. Therefore, the terminal holder 60 temporarily fixed to the substrate 50 is fixed so as not to move in the horizontal width direction. Only the positioning in the horizontal width direction of the terminal holder 60 on one side was described here, but the same is true for the positioning in the horizontal width direction of the terminal holder 60 on the other side.

With the engagement/disengagement mechanisms 30, when the terminal holders 60 are to be removed from the frame 10, the terminal holders 60 are moved backward in the opposite direction from the arrow P in FIG. 6 to cause the leg portions 33 to be displaced within the through-hole portions 34, thus causing the claw portions 32 to slide to the position indicated by the dotted line. After that, when the claw portions 32 are removed from the through-hole portions 34, the terminal holders 60 are removed from the frame 10.

The preferred embodiment described above preferably utilizes, as the attachment members, the terminal holders 60 which are respectively joined, without fastening by screws via the fixing mechanisms 20, to the end portions of the substrate 50 on which the terminals 61 are mounted, in particular, so it is not necessary to perform separate joining of the attachment members to the substrate 50. Because of this, there is no longer a need to use any attachment member separately from the terminal holders 60, which offers the advantage of being able to avoid increasing the number of parts, and the related increases in costs and assembly steps.

With the aforementioned preferred embodiment, a sample case was shown in which a gap S2 (see FIG. 1) corresponding to the height of the horizontally elongated bulging portions 13 is provided between the substrate 50 and the frame 10 by respectively providing the seat portions 31 of the engagement/disengagement mechanisms 30 by the bottom surfaces of the flange portions 65 of the terminal holders 60 and also by forming the through-hole portions 34 in the apex portions 14 of the horizontally elongated bulging portions 13 of the frame 10.

Figure 8:
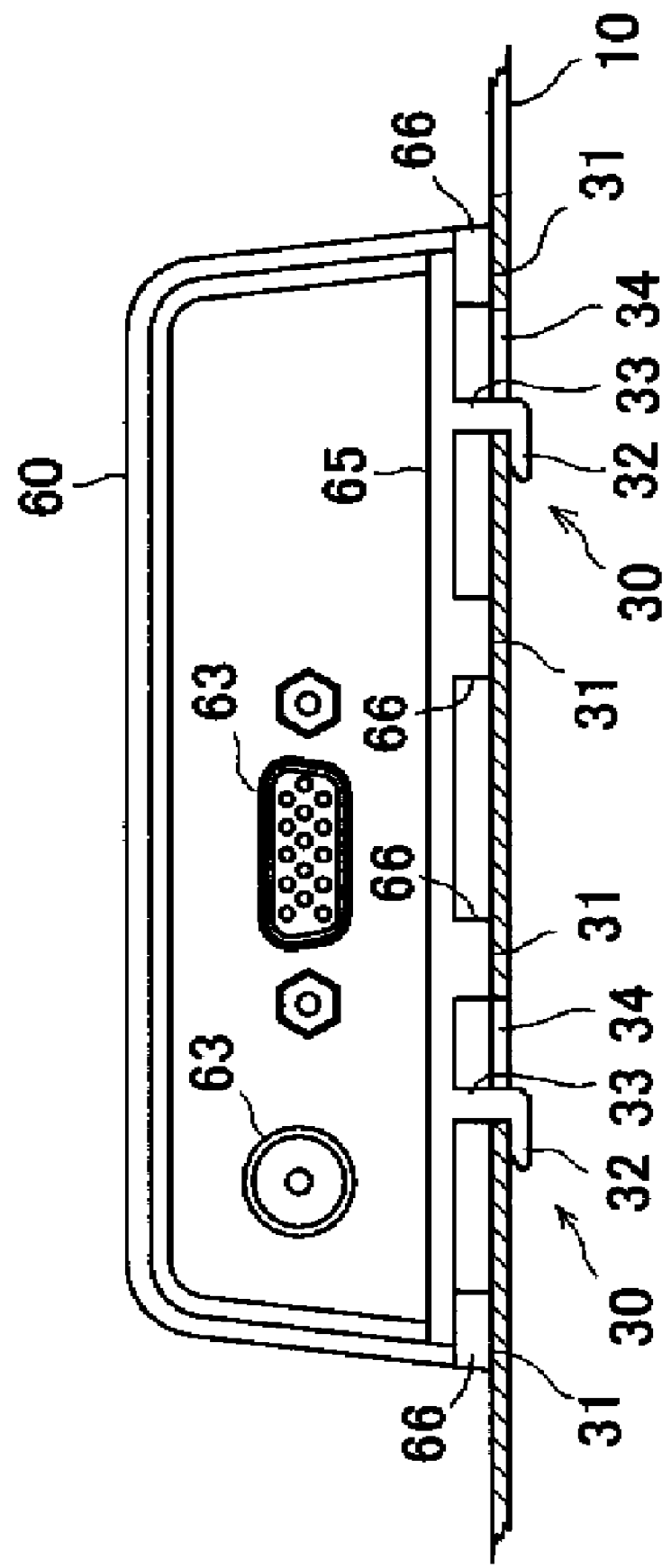
FIG. 8 is a partial fractured side view showing a modified example of one of the engagement/disengagement mechanisms.
Figure 9:
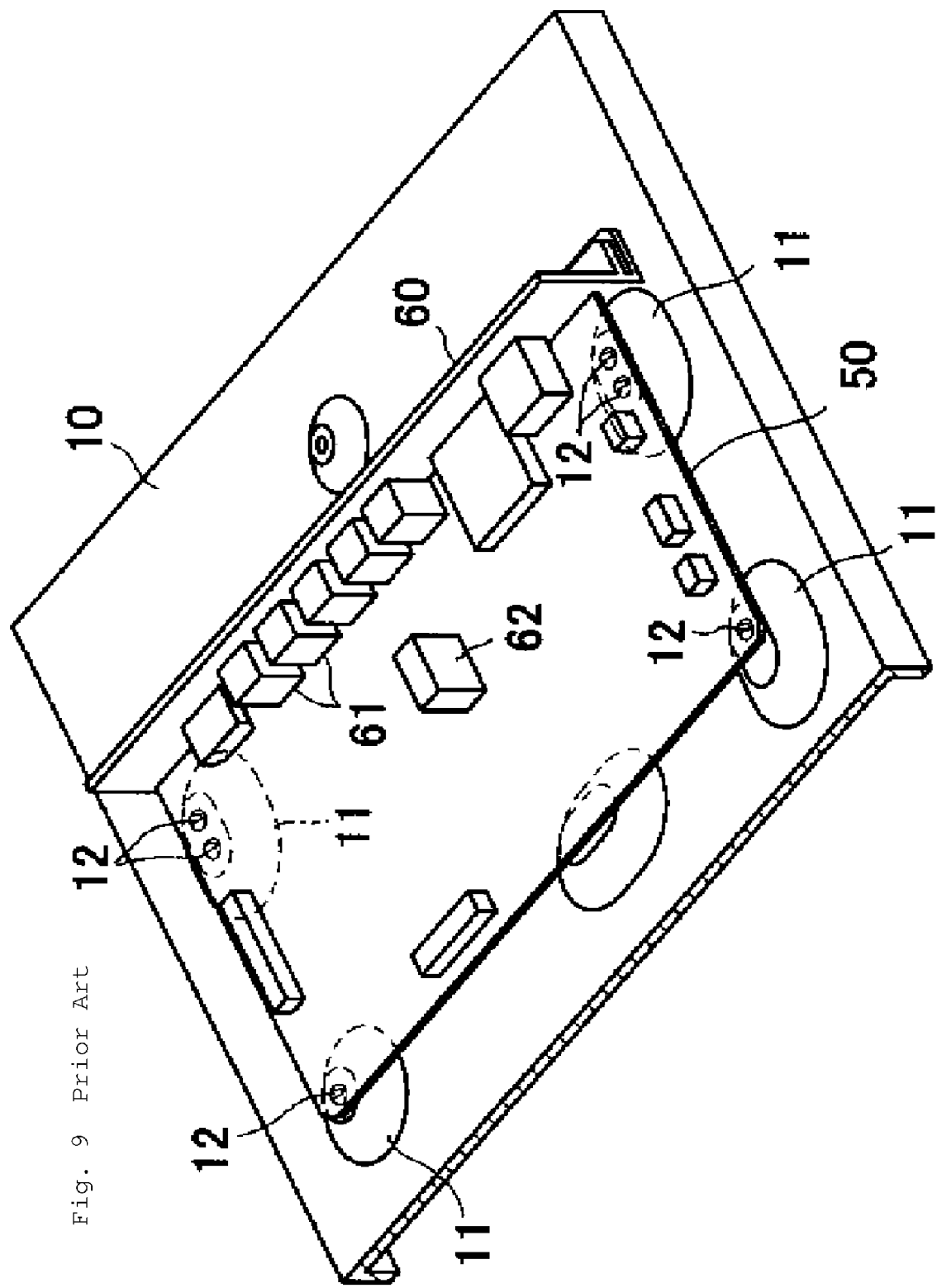
FIG. 9 is a schematic perspective view showing a conventional example of a device substrate attachment structure.

In light of this, FIG. 8 shows a sample case in which the substrate 50 is attached to the frame 10 that has no horizontally elongated bulging portion 13. FIG. 8 is a partial fractured side view showing a modified example of one of the engagement/disengagement mechanisms 30.

In the sample case in this figure, downward-facing protruding portions 66 are provided at a plurality of locations of each terminal holder 60 as an integral unit, and the seat portion 31 of the engagement/disengagement mechanism 30 is defined by the bottom surfaces of these downward-facing protruding portions 66. With this constitution, the height positions of the terminal holders 60 and the substrate 50 are pulled up from the frame 10 by the amount of the jutting width of the downward-facing protruding portions 66, so even though the horizontally elongated bulging portions 13 are not provided on the frame 10, it is possible to secure a necessary gap between the substrate 50 and the frame 10. Furthermore, the same effect can also be achieved by raising the height positions of the bifurcated ribs 21 and the clamping pieces 23 of the fixing mechanisms 20 provided on the side of the terminal holders 60.

Figure 7:
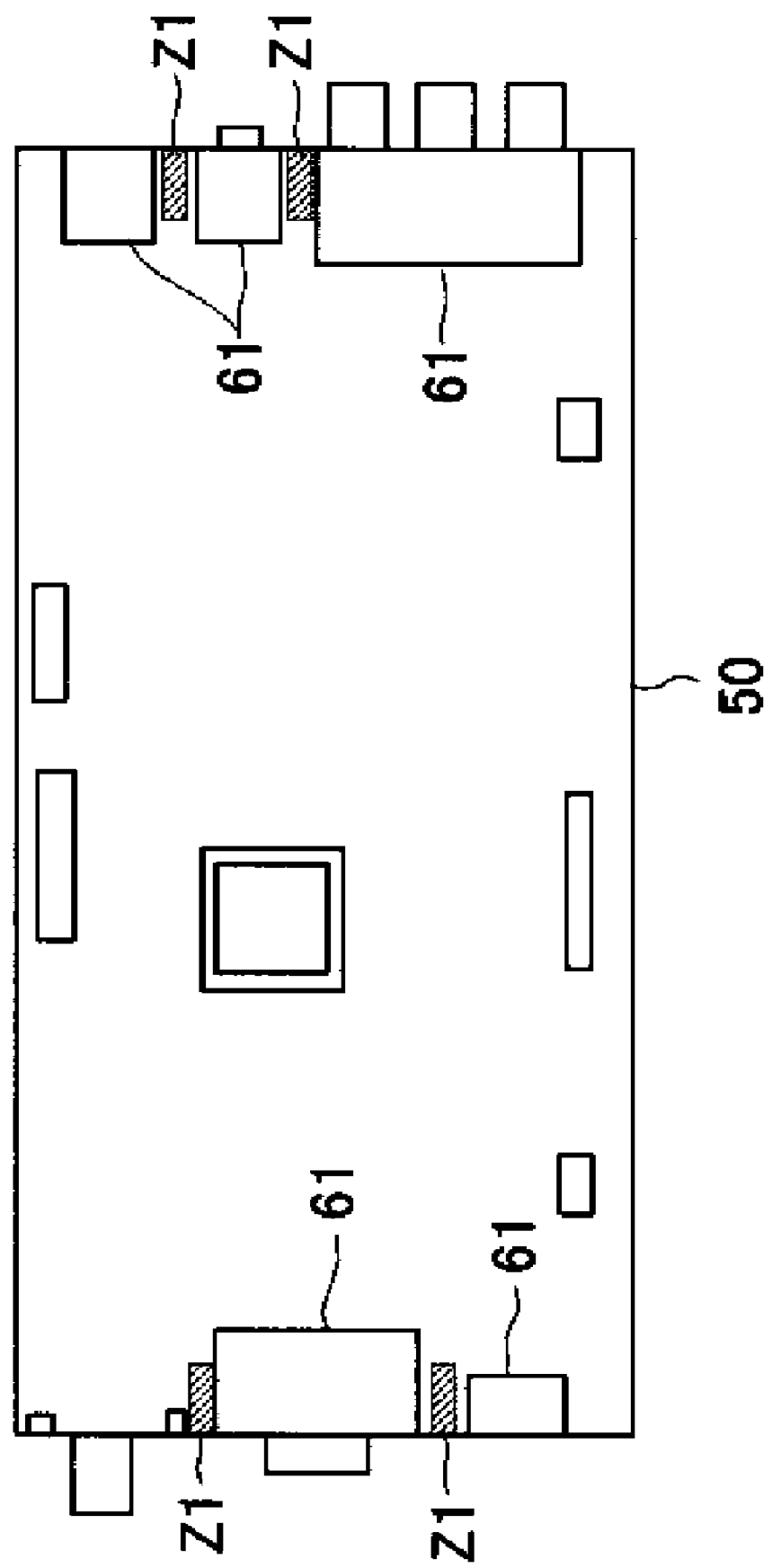
FIG. 7 is an explanatory diagram showing forbidden bands added to the substrate according to a preferred embodiment of the present invention.
Figure 10:
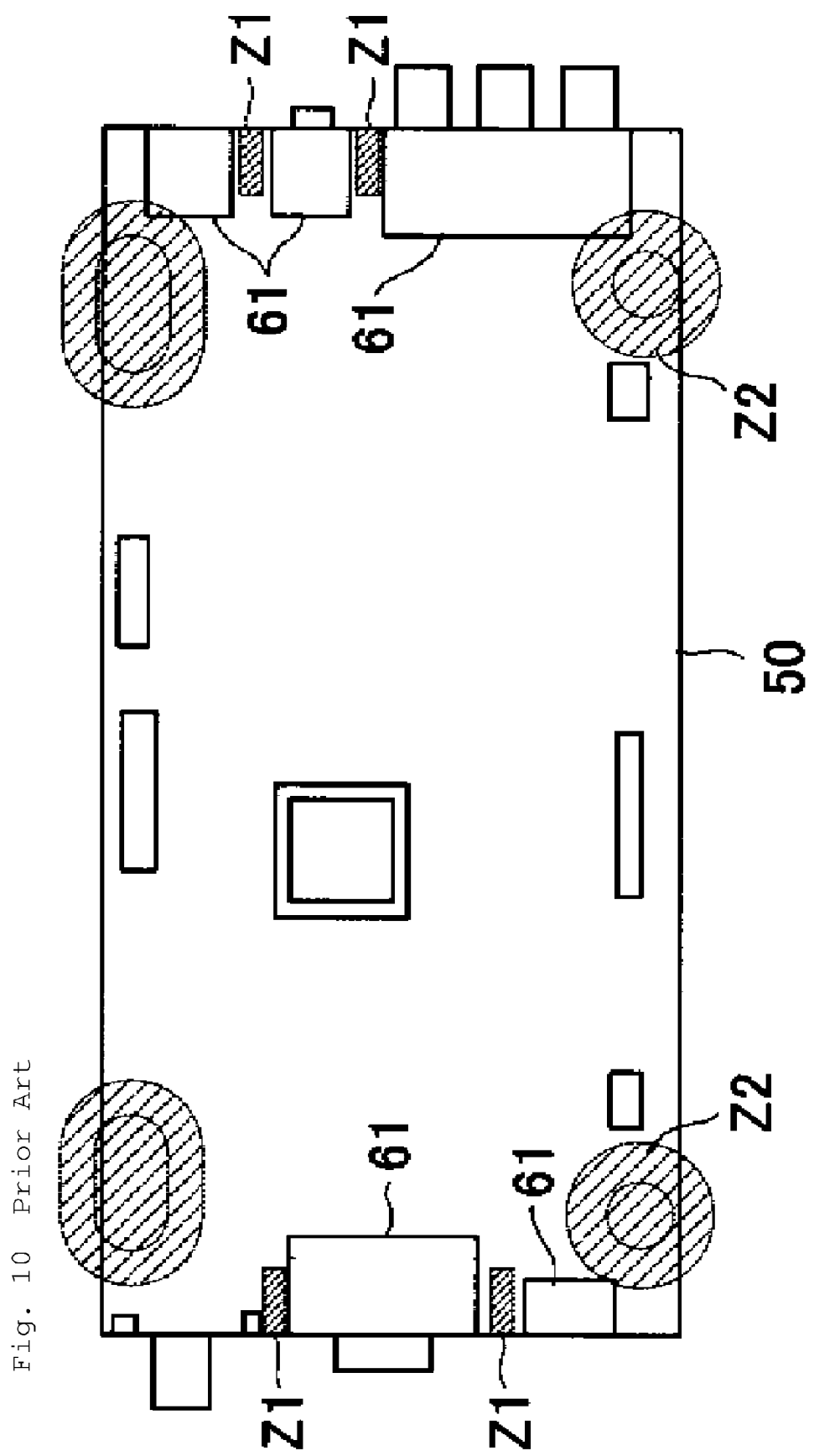
FIG. 10 is an explanatory diagram showing the forbidden bands of the substrate in the conventional example.

FIG. 7 is an explanatory diagram showing forbidden bands added to the substrate 50 which is fixed to the frame 10 by the device substrate attachment structure of a preferred embodiment according to the present invention. The substrate 50 shown in this figure preferably has a rectangular shape, and terminals 61 such as jacks are mounted in a line at each of the two end portions in the lengthwise direction of the substrate 50. When the substrate 50 is attached to the frame 10 by the device substrate attachment structure of the present preferred embodiment, the unavoidable forbidden bands Z1 are provided only at the locations indicated by the dotted-line cross hatching in this figure, i.e., between adjacent terminals 61 arranged in a line, and it is not necessary to provide the forbidden bands Z2 at the locations that face the bulging portions 11 of the frame 10 as in FIG. 10. Because of this, compared to the conventional examples, the surface area of the substrate occupied by the forbidden bands is significantly reduced, which is instrumental for keeping the size of the substrate 50 small.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A device substrate attachment structure comprising:
   a substrate holding body; and
   an attachment mechanism arranged to attach a substrate to the substrate holding body;
   wherein
   the attachment mechanism includes a pair of attachment members attached to the substrate holding body, engagement/disengagement mechanisms arranged to attach the pair of attachment members to the substrate holding body, and fixing mechanisms arranged to join the pair of attachment members to end portions of the substrate; and
   the engagement/disengagement mechanisms include through-hole portions provided in the substrate holding body, seat portions provided on the pair of attachment members which contact hole edge portions of the through-hole portions, claw portions that are arranged to slide between a position at which the claw portions clamps the hole edge portions by engaging with the seat portions and a position at which insertion into and removal from the through-hole portions occurs, leg portions that are inserted into the through-hole portions so as to allow displacement in a sliding direction of the claw portions and that links the claw portions and the pair of attachment members, and positioning mechanisms arranged to contact the pair of attachment members when the claw portions clamps the hole edge portions together with the seat portions.

2. The device substrate attachment structure according to claim 1, further including downward-facing protruding portions positioned on a bottom portion of the substrate holding body and arranged to contact upper surfaces of the engagement/disengagement mechanisms when the claw portions are engaged with the seat portions on bottom surfaces of the engagement/disengagement mechanisms.

3. A device substrate attachment structure, comprising:
   a substrate holding body; and
   an attachment mechanism arranged to attach a substrate to the substrate holding body;
   wherein
   the attachment mechanism includes an attachment member attached to the substrate holding body, an engagement/disengagement mechanism arranged to attach the attachment member to the substrate holding body, and a fixing mechanism arranged to loin the attachment member to an end portion of the substrate; and
   the engagement/disengagement mechanism includes a through-hole portion provided in the substrate holding body, a seat portion provided on the attachment member and that contacts a hole edge portion of the through-hole portion, a claw portion that is arranged to slide between a position at which the claw portion clamps the hole edge portion by engaging with the seat portion and a position at which insertion into and removal from the through-hole portion occurs, a leg portion that is inserted into the through-hole portion so as to allow displacement in a sliding direction of the claw portion and that links the claw portion and the attachment member, and a positioning mechanism arranged to contact the attachment member when the claw portion clamps the hole edge portion together with the seat portion;
   wherein
   the attachment member is defined by a terminal holder that holds terminals mounted on the substrate, a device to be attached by the device substrate attachment structure includes a cabinet having an opening window that exposes the attachment member to outside, and the positioning mechanism is defined by rim portions of the opening window positioned at sides of two end portions of the terminal holder.

4. The device substrate attachment structure according to claim 3, wherein the seat portion of the engagement/disengagement mechanism is defined by a surface of the terminal holder which faces the claw portion in a vertical direction with respect to the terminal holder.

5. The device substrate attachment structure according to claim 3, wherein the fixing mechanism includes a pair of ribs that defines a gap in which the end portion of the substrate is inserted, a clamping piece that clamps the substrate in a direction perpendicular or substantially perpendicular to a direction of insertion of the substrate into the gap, and an engagement claw that is provided on the clamping piece and that engages with a recessed portion provided in the substrate to inhibit displacement of the substrate in a direction of removal from the gap, and the pair of ribs and the clamping piece that includes the engagement claw are made of resin with the attachment member to define an integral monolithic unit.

6. A device substrate attachment structure comprising:
   a substrate; and
   a pair of attachment members attached to end portions of the substrate; and
   a substrate support to which the pair of attachment members are attached;
wherein the pair of attachment members each include an engaging portion; and
   the substrate support includes portions to be engaged which engage with the engaging portions;
   wherein the pair of attachment members are defined by terminal holders which are arranged to hold terminals mounted on the substrate, a device to be attached by the device substrate attachment structure includes a cabinet with opening windows that expose the pair of attachment members to an outside, and positioning mechanisms are defined by rim portions of the opening windows positioned at both sides of two end portions of the terminal holders;
   further including engagement/disengagement mechanisms defined by surfaces of terminal holders which face claw portions.

* * * * *